United States Patent
Pflueger et al.

(10) Patent No.: US 10,539,246 B2
(45) Date of Patent: Jan. 21, 2020

(54) PRESSURE EQUALIZATION ELEMENT HAVING A MEMBRANE, HOUSING, BATTERY CELL MODULE, AND MOTOR VEHICLE

(71) Applicants: Robert Bosch GmbH, Stuttgart (DE); Samsung SDI Co., Ltd., Yongin-si, Gyeonggi-do (KR)

(72) Inventors: Claus Gerald Pflueger, Markröningen (DE); Olaf Nahrwold, Ludwigshafen (DE); Alexander Vasilico, Söll/T (AT); Clemens Schupp, Villingen-Schwenningen (DE)

(73) Assignees: Robert Bosch GmbH, Stuttgart (DE); Samsung SDI Co., Ltd, Yongin-si, Gyeonggi-do (KR)

( * ) Notice: Subject to any disclaimer, the term of this patent is extended or adjusted under 35 U.S.C. 154(b) by 78 days.

(21) Appl. No.: 15/314,021

(22) PCT Filed: May 15, 2015

(86) PCT No.: PCT/EP2015/060745
§ 371 (c)(1),
(2) Date: Nov. 25, 2016

(87) PCT Pub. No.: WO2015/180971
PCT Pub. Date: Dec. 3, 2015

(65) Prior Publication Data
US 2017/0187018 A1     Jun. 29, 2017

(30) Foreign Application Priority Data
May 28, 2014   (DE) .................. 10 2014 210 231

(51) Int. Cl.
*F16K 15/14*       (2006.01)
*F16K 24/00*       (2006.01)
(Continued)

(52) U.S. Cl.
CPC ............ *F16K 15/144* (2013.01); *F16K 24/00* (2013.01); *H01M 2/1211* (2013.01);
(Continued)

(58) Field of Classification Search
CPC .. F16K 15/144; F16K 24/00; Y10T 137/7779; Y10T 137/7843; F04B 53/106
See application file for complete search history.

(56) References Cited

U.S. PATENT DOCUMENTS 5,697,770 A * 12/1997 Schulz ................. F02M 37/046
137/512.4
6,334,761 B1   1/2002 Tai et al.
(Continued)

FOREIGN PATENT DOCUMENTS

CN         1135577 A     11/1996
DE      44 46 170 A1      6/1996
(Continued)

OTHER PUBLICATIONS

International Search Report corresponding to PCT Application No. PCT/EP2015/060745, dated Sep. 7, 2015 (German and English language document) (7 pages).

*Primary Examiner* — Kevin F Murphy
(74) *Attorney, Agent, or Firm* — Maginot, Moore & Beck LLP

(57) ABSTRACT

A pressure equalization element for a housing, such as a lithium-ion accumulator, includes a membrane and at least two parallel non-return valves. The membrane is connected in series to the non-return valves, which are positioned opposite each other. The non-return valves are formed by two valve plates and a valve membrane. The plates define at least one outlet chamber and at least one inlet chamber which each have a respective entry opening and exit opening. The membrane is positioned between the plates and includes at least two valve dampers, the entry openings of (Continued)

the inlet and outlet chambers sealed by a respective damper. Pressure equalization elements of this type can thus be cost-effectively and logically implemented via few components, while avoiding loose components. Such elements can be included in, for example, a housing, battery cell module, or motor vehicle.

12 Claims, 2 Drawing Sheets

(51) Int. Cl.
  *H01M 2/12* (2006.01)
  *H01M 10/0525* (2010.01)
(52) U.S. Cl.
  CPC ..... *H01M 2/1276* (2013.01); *H01M 10/0525* (2013.01); *H01M 2220/20* (2013.01); *Y10T 137/7779* (2015.04); *Y10T 137/7843* (2015.04)

(56) References Cited

U.S. PATENT DOCUMENTS

2013/0306894 A1* 11/2013 Wei .................. F16K 25/00
  251/129.15
2014/0079964 A1  3/2014 Gless et al.

FOREIGN PATENT DOCUMENTS

| DE | 10 2005 029 730 A1 | 2/2007 |
| DE | 10 2012 202 103 A1 | 8/2013 |
| DE | 10 2013 213 909 A1 | 1/2015 |
| EP | 0 247 824 A2 | 12/1987 |
| EP | 2 036 413 B1 | 5/2011 |

* cited by examiner

PRESSURE EQUALIZATION ELEMENT HAVING A MEMBRANE, HOUSING, BATTERY CELL MODULE, AND MOTOR VEHICLE

This application is a 35 U.S.C. § 371 National Stage Application of PCT/EP2015/060745, filed on May 15, 2015, which claims the benefit of priority to Serial No. DE 10 2014 210 231.6, filed on May 28, 2014 in Germany, the disclosures of which are incorporated herein by reference in their entirety.

The present disclosure relates to a pressure equalization element for a housing, having a membrane, a housing, a battery cell module and a motor vehicle.

BACKGROUND

A considerable need exists for mobile and stationary batteries for a wide range of applications, for example for motor vehicles, stationary plants, such as wind turbine installations, and mobile electronic devices, such as laptops and communication devices. Very high demands are placed on these batteries in respect of their reliability, service life and capacity.

A battery cell consists internally of electrochemical elements, which react with sensitivity to external influences such as pressure differences, air or moisture and must accordingly be protected from these as far as possible.

The presence of a so-called lithium-ion conducting salt is thus necessary for intercalation and deintercalation, for example, in lithium-ion cells. Lithium hexafluorophosphate ($LiPF_6$) is used as a lithium conducting salt both for battery cells with a lower charge, for example of the kind which find an application in portable electronic devices, and in battery cells intended for the automotive sector. This conducting salt is extremely reactive to moisture, with the result that hydrogen fluoride (HF) may be produced by hydrolysis.

In particular in automotive applications for lithium-ion storage technology, however, pressure equalization must take place between the interior of the housing for the battery and the surroundings, since otherwise the housing may be compressed by high differences in the ambient pressure or may expand strongly in another case. High differences in pressure are encountered in air transport, when travelling in mountainous regions, as a result of daily fluctuations in pressure and high fluctuations in temperature. In extreme cases, this can result in the destruction of the housing for the battery as a result of extreme mechanical loading.

Therefore, a permanently occurring volume replacement between the interior of the housing and the environment is assured by means of a pressure equalization element. The pressure equalization element may be constituted by a membrane. Since a certain proportion of water vapor is always present in the ambient air, this passes through the membrane and into the housing as a result of volume replacement and diffusion.

A desiccant is generally used in order to prevent the aforementioned problems due to the presence of condensation water in the interior of the housing. However, a desiccant mass of several kilograms over a service life of a number of years is required, even in the case of the smallest housing volumes, or else provision must be made for the replacement of the desiccant.

Described in DE 10 2012 202 103 A1 is a pressure equalization element for a lithium-ion accumulator, in which a membrane is connected in series with two valves arranged parallel and in opposition to each other. In addition, a desiccant may be provided in the pressure equalization element.

SUMMARY

A pressure equalization element for a housing, which has a membrane which is connected in series with at least two non-return valves arranged parallel and in opposition to each other, is made available according to the disclosure, wherein, in order to constitute the at least two non-return valves, the pressure equalization element has two valve plates, which are of a nature such that at least one outlet chamber and at least one inlet chamber are present in between. The at least one outlet chamber and the at least one inlet chamber that is physically separate therefrom each possess one inlet opening and one outlet opening. A valve membrane is present between the two valve plates and is secured by the valve plates, which valve membrane has at least two valve caps, that is to say preferably reinforced areas, preferably being reinforced in cylindrical form, of the valve membrane, which respectively seal the inlet openings of the at least one outlet chamber and of the at least one inlet chamber.

The valve plates are securely connected to one another by appropriate means or measures.

The non-return valves can thus be produced advantageously from only three component parts, since the valve membrane and the valve caps are preferably configured in a single piece, thereby avoiding loose component parts.

In addition, a disclosed embodiment provides a reliable valve function in a simple realization.

The valve membrane must have passage openings in order to permit the pressure equalization. These are preferably configured in such a way that the valve flaps are surrounded by them, wherein, for the exact positioning of the valve flaps in relation to the rest of the valve membrane, at least one connection, and preferably two or three connections, must be present between the valve flap and the valve membrane.

The at least one connection is preferably of resilient configuration, such that, by means of spring force, the non-return valves can be configured according to the respective requirements or having regard for the desired opening pressure.

The resilient configuration of the at least one connection can be effected by the choice of an elastic material for the valve membrane and/or by an appropriate physical layout of the at least one connection, and preferably as a meander spring.

Suitable materials, preferably polymers, and most preferably elastomers, are familiar to a person skilled in the art.

In order to reduce the overall number of component parts required for the pressure equalization element, the valve membrane is preferably provided with a molded-on O-ring, which is necessary for the sealing of the pressure equalization element in relation to a housing.

The O-ring surrounds the valve membrane, which is preferably of round configuration, and is connected to the latter via at least one, and preferably two to four stays.

This embodiment of the valve membrane with a molded-on O-ring is preferably produced from an elastomer, such that the sealing effect is as high as possible.

Since the O-ring runs around the valve plates, the valve plates exhibit corresponding grooves, through which are guided stays which lead to the valve membrane.

According to a preferred embodiment of the disclosure, the valve membrane exhibits thickenings or stays in those areas in which it is contacted by the valve plates, in order to provide enhanced sealing of the valve plates or the inlet and outlet chambers towards the outside and between one another.

The valve membrane in its various embodiments advantageously offers the production of cavity plates with associated process reliability and improved handling for pick-and-place assembly robots.

The membrane is only gas-permeable, so that solid impurities and liquids are retained. According to a preferred embodiment, the membrane can have a hydrophobic and/or oleophobic function, such that increased protection is afforded against liquids, in particular water and/or oils.

According to a further embodiment of a pressure equalization device, a second membrane is provided on the side of the non-return valves facing away from the first membrane, in order to keep any contamination that may be present from the interior of the housing provided with pressure equalization away from the non-return valves.

Suitable materials for suchlike membranes are familiar from the prior art to a person skilled in the art, and membranes made from polytetrafluoroethylene (PTFE) or polyethylene terephthalate (PET) are preferred.

According to a particularly preferred embodiment of the pressure equalization element, this is provided with a desiccant, which is preferably disposed in a desiccant container, with at least two non-return valves being disposed downstream thereof. As a result, in the course of the pressure equalization, the air that may be charged with vapor is passed through the desiccant that is present inside the housing, and any moisture is securely bound.

By this means, it is possible advantageously to guarantee reliably that any moisture is prevented from penetrating into the housing, with the result that corrosion and short-circuits can be reliably eliminated.

The quantity of desiccant can be calculated so that it remains adequate over the service life, for example of an accumulator which is disposed in the housing.

As an alternative, the quantity of desiccant can be contained inside a replaceable desiccant container, which can be replaced at set intervals. Particularly advantageous in this case is the fact that the required quantity of desiccant can be kept even smaller than in the other embodiments of the disclosure.

Suitable desiccants are generally familiar from the prior art to a person skilled in the art. Silica, a molecular sieve or clay-based desiccants are preferred.

The membrane is preferably provided with a protective cap, which is also able to function as a basic holder or housing, such that mechanical damage to the membrane can be prevented. Protection against spraying water is thereby assured, for example when using a steam-jet cleaning appliance or in the case of stone chipping impacts.

In addition, a housing having a pressure equalization element according to this disclosure, is intended for components or devices that are sensitive to moisture, in which the formation of condensate is not acceptable, such as control units or battery modules.

Accordingly, the object of this disclosure is also a battery cell module or a battery pack, in particular a lithium-ion accumulator having a housing, wherein the battery cell module or the battery pack may have a control unit.

In addition, the disclosure has as its object a motor vehicle, in particular a motor vehicle driven by an electric motor, which has at least one battery cell module, which is connected to a drive system of the motor vehicle.

Advantageous further developments of the disclosure are indicated in the claims and are described in the description.

BRIEF DESCRIPTION OF THE DRAWINGS

Illustrative embodiments of the disclosure are explained in more detail on the basis of the drawings and the following description. In the drawings.

DETAILED DESCRIPTION

Figure 1:
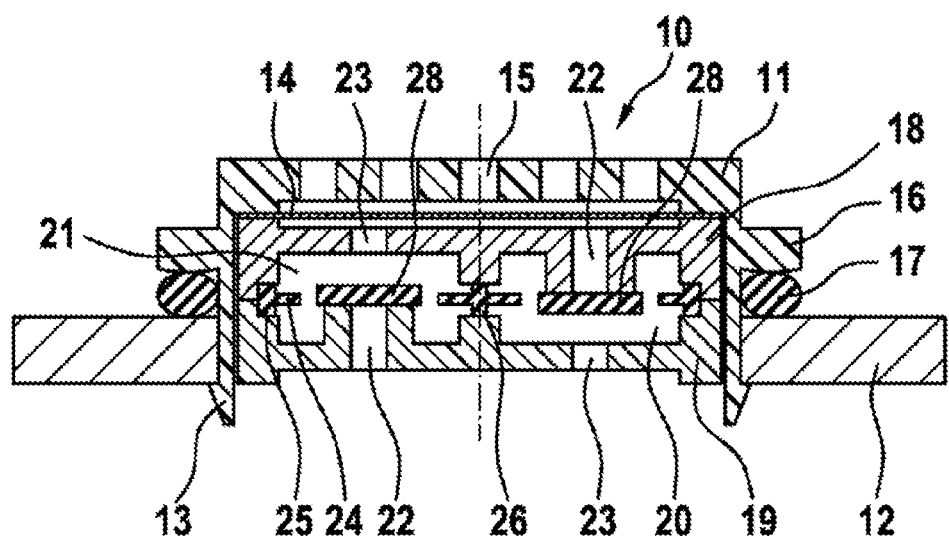
FIG. 1 depicts an inventive pressure equalization element in a cutaway view.

FIG. 1 depicts a pressure equalization element 10 according to this disclosure, which is arranged above a basic holder 11 in a passage opening of a wall 12 of a housing that is not described in more detail here. The basic holder 11 is secured on the inside of the housing by means of a snap closure 13. Other means of attachment are possible. The basic holder 11 serves at the same time according to this embodiment as a protective cap for a membrane 14 arranged in the basic holder 11. The basic holder 11 has a number of passage openings 15 for the inlet or the outlet of air or for pressure equalization.

Figure 2:
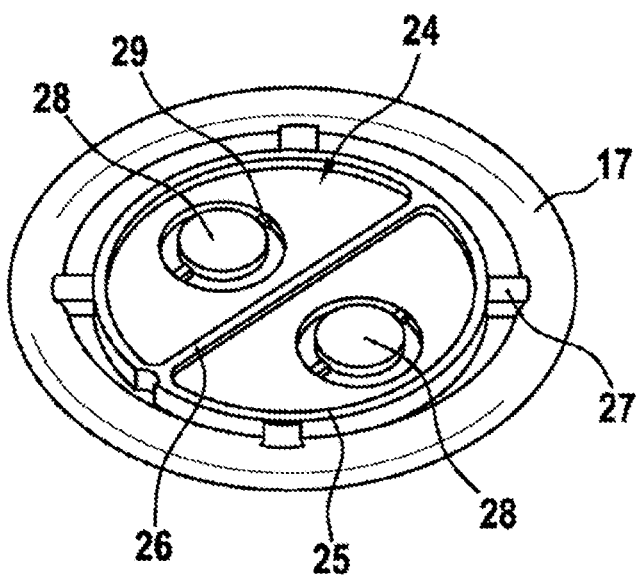
FIG. 2 depicts a first embodiment of the valve membrane of the inventive pressure equalization membrane in a perspective view.
Figure 3:
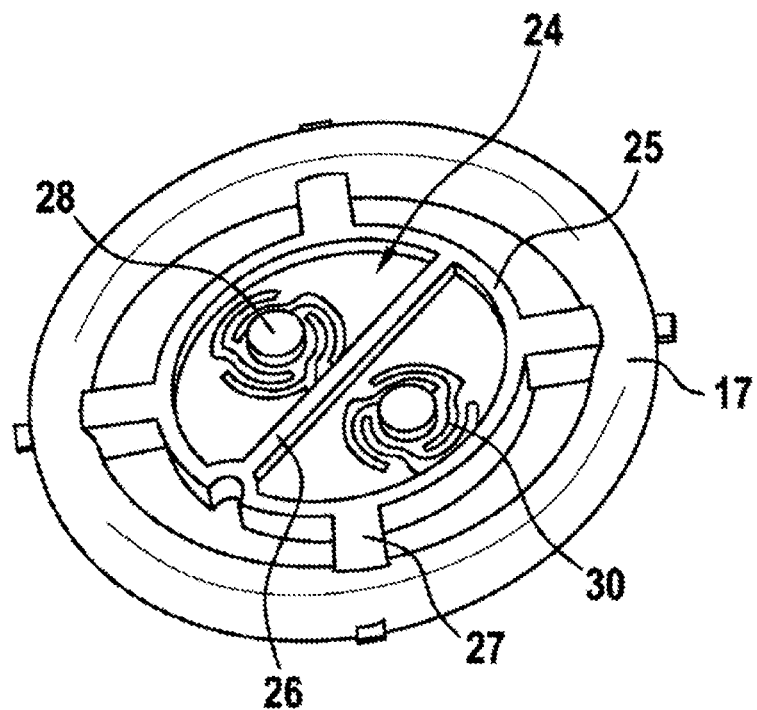
FIG. 3 depicts a second embodiment of the valve membrane of the inventive pressure equalization membrane in a perspective view.
Figure 4:
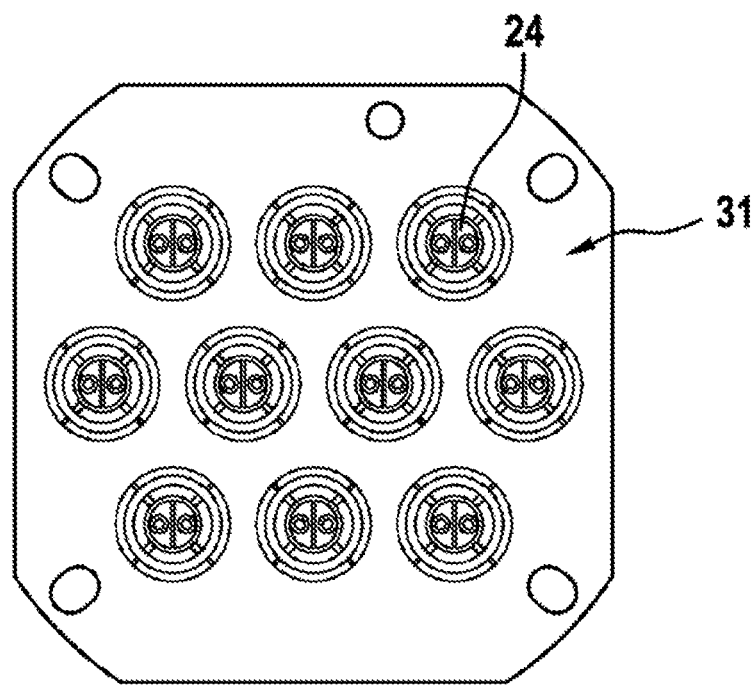
FIG. 4 depicts a cavity plate for valve membranes of the inventive pressure equalization membrane in a top view.

The basic holder 11 exhibits circumferentially a projecting section 16, wherein an O-ring 17 for sealing is arranged between said section 16 and the wall. Situated downstream of the membrane 14 in the interior of the basic holder 11 are two valve plates 18 and 19, which together constitute an outlet chamber 20 and an inlet chamber 21, each of which exhibits an inlet opening 22 and an outlet opening 23, wherein the inlet openings 22 are extended into the inlet chamber 21 and the outlet chamber 20 as far as the center of the space. Arranged between the two valve plates 18 and 19 is a valve membrane 24, which, on the one hand, serves for the sealing of the valve plates 18 and 19 against one another, and, on the other hand, serves for the separation of the inlet chamber 21 and the outlet chamber 20. The valve membrane 24, which is represented in more detail in FIGS. 2 and 4, exhibits a round central part, which possesses a circumferential stay 25 and a second stay 26, which divides the valve membrane centrally. The stays 25 and 26 are provided on the upper side and the lower side of the valve membrane 24 and serve, as previously stated, for sealing and subdivision. Furthermore, the valve membrane 24 exhibits circumferentially the aforementioned O-ring 17, which is secured to the valve membrane 24 by multiple stays 27. The stays 27 pass through openings, which are not illustrated here in more detail, through the valve plates 18, 19 and the basic holder 11. Arranged in the two parts of the valve membrane 24, in each case in a passage opening, is a cylindrical valve cap 28, which are retained by stays 29 or meander springs 30. The valve caps 28 in the finally assembled pressure equalization element 10 cover the inlet openings 22 and uncover these in the presence of a predetermined pressure. FIG. 4 depicts a so-called cavity plate 31 for the efficient production of the valve membrane 24.

The invention claimed is:

1. A pressure equalization element for a housing, comprising:
   at least two non-return valves arranged in parallel and positioned in opposition to each other, the at least two non-return valves formed by:
      two valve plates that define:
         at least one inlet chamber with an inlet opening and an outlet opening; and
         at least one outlet chamber with an inlet opening and an outlet opening; and
      a valve membrane positioned between the two valve plates, the valve membrane including at least two valve caps, each valve cap sealing off a respective inlet opening of the at least one inlet chamber and at least one outlet chamber, the valve membrane further including a circumferential O-ring;
   a membrane connected in series with the at least two non-return valves; and
   a protective cap defining a hollow interior,
   wherein the membrane and the two valve plates are received within the hollow interior, and
   wherein the circumferential O-ring is arranged in direct contact with the protective cap.

2. The pressure equalization element as claimed in claim 1, wherein the at least two valve caps are resiliently connected to the valve membrane by a resilient connection.

3. The pressure equalization element as claimed in claim 2, further comprising:
   at least one meander spring, each meander spring forming the resilient connection of a respective one of the at least two valve caps.

4. The pressure equalization element as claimed in claim 2, wherein the at least two valve caps, the valve membrane, and the resilient connection are embodied in a single piece.

5. The pressure equalization element as claimed in claim 1, wherein the circumferential O-ring is molded on the valve membrane.

6. The pressure equalization element as claimed in claim 1, further comprising:
   a drying mechanism, connected to an output side of the membrane and the at least two non-return valves.

7. The pressure equalization element as claimed in claim 1, wherein the circumferential O-ring is arranged radially outwardly of the protective cap.

8. A pressure equalization element for a housing, comprising:
   at least two non-return valves arranged in parallel and positioned in opposition to each other, the at least two non-return valves formed by:
      two valve plates that define:
         at least one inlet chamber with an inlet opening and an outlet opening; and
         at least one outlet chamber with an inlet opening and an outlet opening; and
      a valve membrane positioned between the two valve plates, the valve membrane including at least two valve caps, each valve cap sealing off a respective inlet opening of the at least one inlet chamber and at least one outlet chamber, the valve membrane further including a circumferential O-ring;
   a membrane connected in series with the at least two non-return valves; and
   a protective cap configured to cover the membrane, wherein:
   the circumferential O-ring is arranged in direct contact with the protective cap, and
   the valve membrane further includes:
      an upper side and a lower side arranged facing in opposite directions, and
      a circumferential stay extending from the upper side and from the lower side, the circumferential stay arranged radially inwardly of the circumferential O-ring and radially outwardly of the at least two valve caps.

9. The pressure equalization element as claimed in claim 8, wherein:
   the valve membrane further includes further stays coupling the circumferential O-ring to the circumferential stay.

10. The pressure equalization element as claimed in claim 8, wherein:
    the valve member further includes a second stay extending from the upper side and from the lower side, and
    the second stay extends from a first location on the circumferential stay to a second location on the circumferential stay.

11. The pressure equalization element as claimed in claim 10, wherein the second stay is at least partially arranged between the at least two valve caps.

12. A pressure equalization element for a housing, comprising:
    at least two non-return valves arranged in parallel and positioned in opposition to each other, the at least two non-return valves formed by:
       two valve plates that define:
          at least one inlet chamber with an inlet opening and an outlet opening; and
          at least one outlet chamber with an inlet opening and an outlet opening; and
       a valve membrane positioned between the two valve plates, the valve membrane including at least two valve caps, each valve cap sealing off a respective inlet opening of the at least one inlet chamber and at least one outlet chamber, the valve membrane further including a circumferential O-ring;
    a membrane connected in series with the at least two non-return valves; and
    a protective cap configured to cover the membrane, wherein:
    the circumferential O-ring is arranged in direct contact with the protective cap, and
    the membrane is in direct contact with the protective cap and with a first valve plate of the two valve plates.

* * * * *